(12) United States Patent
Ko et al.

(10) Patent No.: US 10,602,643 B2
(45) Date of Patent: Mar. 24, 2020

(54) COOLING SYSTEM AND METHOD USING HYDROTHERMAL ENERGY

(71) Applicant: NAVER Business Platform Corp., Seongnam-si, Gyeonggi-do (KR)

(72) Inventors: Jeongbeom Ko, Seongnam-si (KR); Ji Hyun Koo, Seongnam-si (KR); Sang Min Roh, Seongnam-si (KR); Hun Nam Ji, Seongnam-si (KR); Eun Ho Lee, Seongnam-si (KR)

(73) Assignee: Naver Business Platform Corp., Gyeonggi-do (KR)

( * ) Notice: Subject to any disclaimer, the term of this patent is extended or adjusted under 35 U.S.C. 154(b) by 56 days.

(21) Appl. No.: 16/046,288

(22) Filed: Jul. 26, 2018

(65) Prior Publication Data

US 2019/0037736 A1    Jan. 31, 2019

(30) Foreign Application Priority Data

Jul. 27, 2017 (KR) .......................... 10-2017-0095654

(51) Int. Cl.
*H05K 7/20* (2006.01)
*F25B 23/00* (2006.01)
*F25B 49/00* (2006.01)
*F28C 1/00* (2006.01)

(52) U.S. Cl.
CPC .......... *H05K 7/20836* (2013.01); *F25B 23/00* (2013.01); *F25B 49/00* (2013.01); *F28C 1/00* (2013.01); *H05K 7/20745* (2013.01); *H05K 7/20827* (2013.01); *F25B 2700/2106* (2013.01); *F28C 2001/006* (2013.01)

(58) Field of Classification Search
CPC .......... H05K 7/20836; H05K 7/20827; H05K 7/20745; F25B 23/00; F25B 49/00; F25B 2700/2106; F25B 29/003; F28C 1/00; F28C 2001/006; F25D 16/00
See application file for complete search history.

(56) References Cited

U.S. PATENT DOCUMENTS

2015/0276292 A1* 10/2015 Son .......................... F28C 1/00
                                                            62/135

FOREIGN PATENT DOCUMENTS

JP    H05302770 A    11/1993
KR    10-1548328 B1   8/2015

OTHER PUBLICATIONS

Korean Office Action dated Sep. 10, 2019 for corresponding Korean Application No. 10-2017-0095654.

* cited by examiner

*Primary Examiner* — Emmanuel E Duke
(74) *Attorney, Agent, or Firm* — Harness, Dickey & Pierce, P.L.C.

(57) ABSTRACT

A cooling system and associated method may be used to perform cooling using the hydrothermal energy of supply water stored in a supply water tank that is to be complementarily supplied to a cooling tower of a freezer.

17 Claims, 7 Drawing Sheets

COOLING SYSTEM AND METHOD USING HYDROTHERMAL ENERGY

CROSS-REFERENCE TO RELATED APPLICATION

This application claims priority under 35 U.S.C. § 119 to Korean Patent Application No. 10-2017-0095654, filed on Jul. 27, 2017 with the Korean Intellectual Property Office, the disclosure of which is incorporated herein by reference.

BACKGROUND

1. Field

The following description of example embodiments relates to a cooling system and method using hydrothermal energy.

2. Description of the Related Art

Servers, network equipment, and enterprise equipment installed in a data center generate heat. Thus, the data center with such equipment also includes a large scale of equipment to cool/remove the heat. To cool/remove the heat generated in the data center, cold air can be supplied to each piece of equipment.

Hydrothermal energy refers to energy that may be used as a heat source for cooling or heating of a building, a farmhouse, or an industry using heat, for example, cold or hot, of water resources, for example, water. For example, heat from a lake, a dam, marine water, or a sewage may be used for cooling or heating.

Although a technique of using the hydrothermal energy for cooling the data center may be considered, significantly high investment cost may be required to attract external water resources to the data center, and a maintenance and management issue may arise. In addition, using external water resources may require consultation with related organizations that manage water resources.

Furthermore, if a problem occurs, a dispute as to responsibility may arise.

SUMMARY

At least one example embodiment provides a cooling system and method that may use, for cooling a data center, hydrothermal energy of supply water stored and maintained in a water tank at all times to be complementarily supplied to a cooling tower for operating a freezer of the data center.

According to an aspect of at least one example embodiment, there is provided a cooling system comprising a water cooling coil (e.g., first cooling coil) configured to cool ambient air using water supplied to an inside; a supply water tank (e.g., supply tank) configured to store supply water in fluidic communication with a cooling tower of a freezer so as to be able to be complementarily supplied to the cooling tower of the freezer; and a hydrothermal cooling circulation pump configured to supply power for supplying and returning the supply water to and from the water cooling coil in order to use, for the water cooling coil, hydrothermal energy of the supply water that is stored in the supply water tank.

According to an aspect of at least one example embodiment, there is provided a cooling method using hydrothermal energy, the method comprising selecting a single cooling scheme from among a plurality of cooling schemes including a first cooling scheme using a freezer and a second cooling scheme using hydrothermal energy of supply water; operating the freezer in response to selecting the first cooling scheme; and supplying the supply water to a water cooling coil that cools ambient air using water supplied to an inside, in response to selecting the second cooling scheme. The supply water comprises water stored in a supply water tank to be complementarily supplied to a cooling tower of the freezer.

According to some example embodiments, it is possible to use, for cooling a data center, hydrothermal energy of supply water that is stored and maintained in a water tank at all times to be complementarily supplied to a cooling tower for operation of a freezer of the data center.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and/or other aspects, features, and advantages will become apparent and more readily appreciated from the following description of embodiments, taken in conjunction with the accompanying drawings of which.

DETAILED DESCRIPTION

Figure 1:
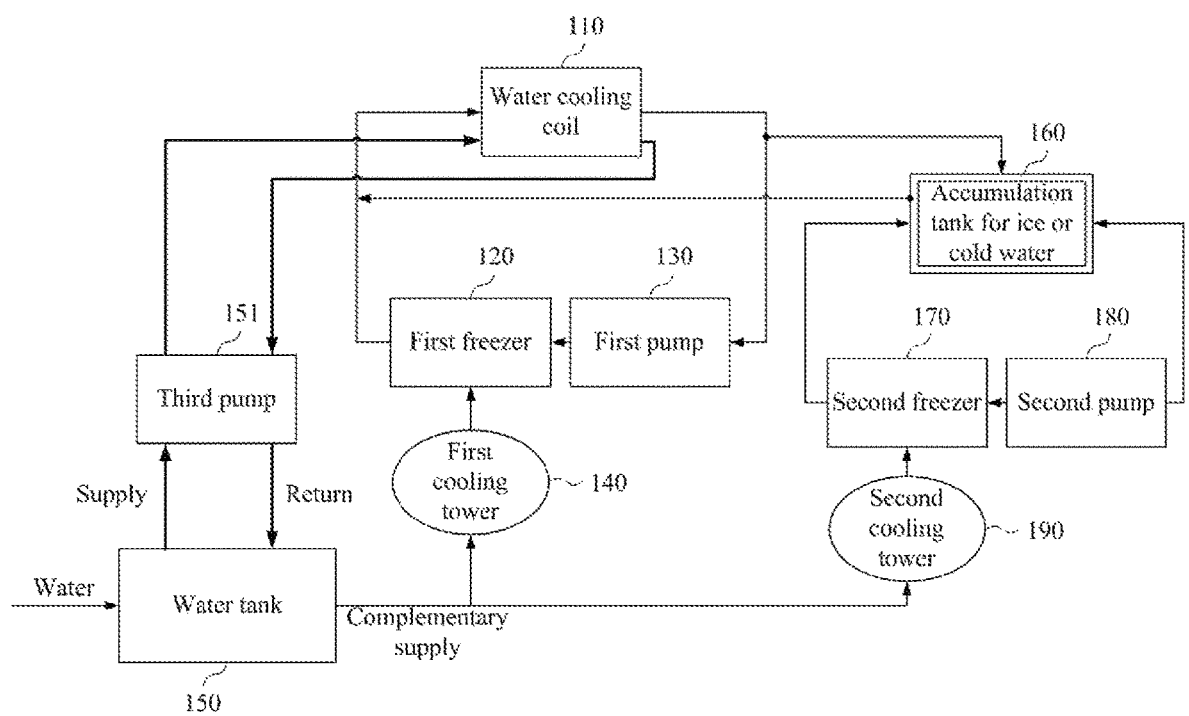
FIG. 1 illustrates an example of a cooling environment of a data center according to an example embodiment.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Hereinafter, example embodiments will be described with reference to the accompanying drawings.

FIG. 1 illustrates an example of a cooling environment of a data center according to an example embodiment. A water cooling coil 110 may serve to absorb heat of air that is supplied to the data center using water flowing in the water cooling coil 110 and to decrease a temperature of the air. Inversely, a temperature of the water flowing in the water cooling coil 110 may increase. For example, in FIG. 1, water at a temperature of 7° C. may flow in the water cooling coil 110 (e.g., via an internal channel) and absorb heat from the air supplied to the data center. As a result, water at a temperature of 12° C. may flow out of the water cooling coil 110.

Here, the water that flows out of the water cooling coil 110 may be cooled down to, for example, 7° C., through a first freezer 120 and may flow again into the water cooling coil 110. A first pump 130 may be used to circulate the water between the water cooling coil 110 and the first freezer 120.

The first freezer 120 may connect to a first cooling tower 140. Here, the term "cooling tower" refers to a heat exchange device that may cool the cooling service water used for a condenser of a freezer through direct contact between the cooling service water and outdoor air. The cooling tower may cool the cooling service water based on a phenomenon that, if water contacts cold air, a portion of the water evaporates, and, here, it is possible to decrease a water temperature using the heat required for such evaporation. Using this phenomenon, the first cooling tower 140 may also cool the cooling service water used for a condenser of the first freezer 120. Here, a water tank 150 may be used to complementarily supply water to the first cooling tower 140. Water may be directly connected to the first cooling tower 140. In this instance, if the supply of the water is disconnected or a water supply line malfunctions, the water may not be smoothly supplied to the first cooling tower 140. To prevent this, a relatively large quantity of water, for example, 1400 to 1700 tonne (t) of water may be stored in the water tank 150. In general, the water tank 150 may be provided in an underground facility and may maintain a water temperature of, for example, about 16 to 19° C., by underground cooling.

Also, an additional freezer may be further used to decrease a temperature of the water that flows into the water cooling coil 110. FIG. 1 discloses additional cooling facilities using ice storage heat or water storage heat. A cooling technique using the ice storage heat refers to a technique for making water into ice during a nighttime and dissolving/melting the ice for cooling, instead of turning on an air conditioner during a daytime when electric consumption peaks. Also, similarly, a cooling technique using the water storage heat refers to a technique for accumulating cold water in a water tank and using the accumulated cold water for cooling if necessary. FIG. 1 illustrates an accumulation tank 160 configured to accumulate ice or cold water, a second freezer 170 configured to produce the ice or the cold water, and a second pump 180 configured to circulate the water between the accumulation tank 160 and the second freezer 170. For example, the ice at a temperature of −4° C. or the cold water at a temperature of 4° C. accumulated in the accumulation tank 160 may flow out of the accumulation tank 160 and be mixed with the water at a temperature of 12° C. flowing out of the water cooling coil 110 to produce mixed water at a temperature of 7° C. Then the mixed water at the temperature of 7° C. may be supplied in the water cooling coil 110. Here, the second freezer 170 may use a second cooling tower 190 and the water tank 150 may also complementarily supply the water to the second cooling tower 190.

Here, although hydrothermal energy is also contained in the supply water stored in the water tank 150 in order to complementarily supply the water to the first cooling tower 140 and/or the second cooling tower 190, the hydrothermal energy of the supply water is not used in the related art. The example embodiments provide a technique for using the hydrothermal energy of the supply water. Also, the term "supply water" used herein may indicate make-up water.

FIG. 1 illustrates an example of using the hydrothermal energy contained in the supply water for cooling by supplying and returning the supply water stored in the water tank 150 to and from the water cooling coil 110 using a third pump 151. An amount of available hydrothermal energy may vary based on the quantity and temperature of supply water stored in the water tank 150. If the supply water stored in the water tank 150 is consecutively used, a temperature of the supply water may not be recovered immediately. Thus, although it is difficult to cool the whole data center with the hydrothermal energy contained in the supply water, the hydrothermal energy may be intermittently used for cooling if necessary. That is, the hydrothermal energy may be used for local cooling or may replace a freezer temporarily in terms of a usage.

For example, temperature requirements between a server and network equipment provided in the data center may differ. For example, the server may require a temperature of 27° C. or less and the network equipment or storage equipment may require a temperature of 25° C. or less. Here, a situation in which a temperature of outside air is 26° C. and cooling proceeds using the outside air may be assumed. Many servers in the data center may be cooled with the outside air only without a need to operate a freezer, for example, the first freezer 120. However, some network equipment may require a temperature of 25° C. or less. Therefore, a freezer may need to be operated for such equipment. In this case, a relatively large amount of power, for example, 550 to 650 KW per unit time, may be used. According to example embodiments, in the above situation, cooling may proceed using supply water of a supply water tank, for example, the water tank 150, that stores the supply water to complementarily supply water to a cooling tower, for example, the first cooling tower 140 and/or the second cooling tower 190. Here, an amount of power, for example, 22 KW per unit time, used for operating a pump, for example, the third pump 151, to supply and return the supply water of the supply water tank to and from a water cooling coil, for example, the water cooling coil 110, is relatively small compared to the amount of power used for operating the freezer. Accordingly, using eco-friendly energy not in use, that is, the hydrothermal energy of the supply water, it is possible to reduce an operation time of the freezer while also saving energy. Also, in terms of using renewable energy, it is possible to reduce an amount of carbon emission. Further, a relatively small investment cost may be used compared to using external hydrothermal energy.

In addition, since a plurality of water cooling coils may be present in the data center, additional cooling may be provided only to an appropriate place by supplying the supply water only to a specific water cooling coil among the plurality of water cooling coils. In the aforementioned example of the server and the network equipment, additional cooling may proceed locally by supplying the supply water to a water cooling coil present in a place in which the network equipment is provided. For example, if a cooling operation is performed on a plurality of sections based on a scale of the data center, the supply water may be supplied to a water cooling coil of a section in which the network equipment is provided.

Figure 2:
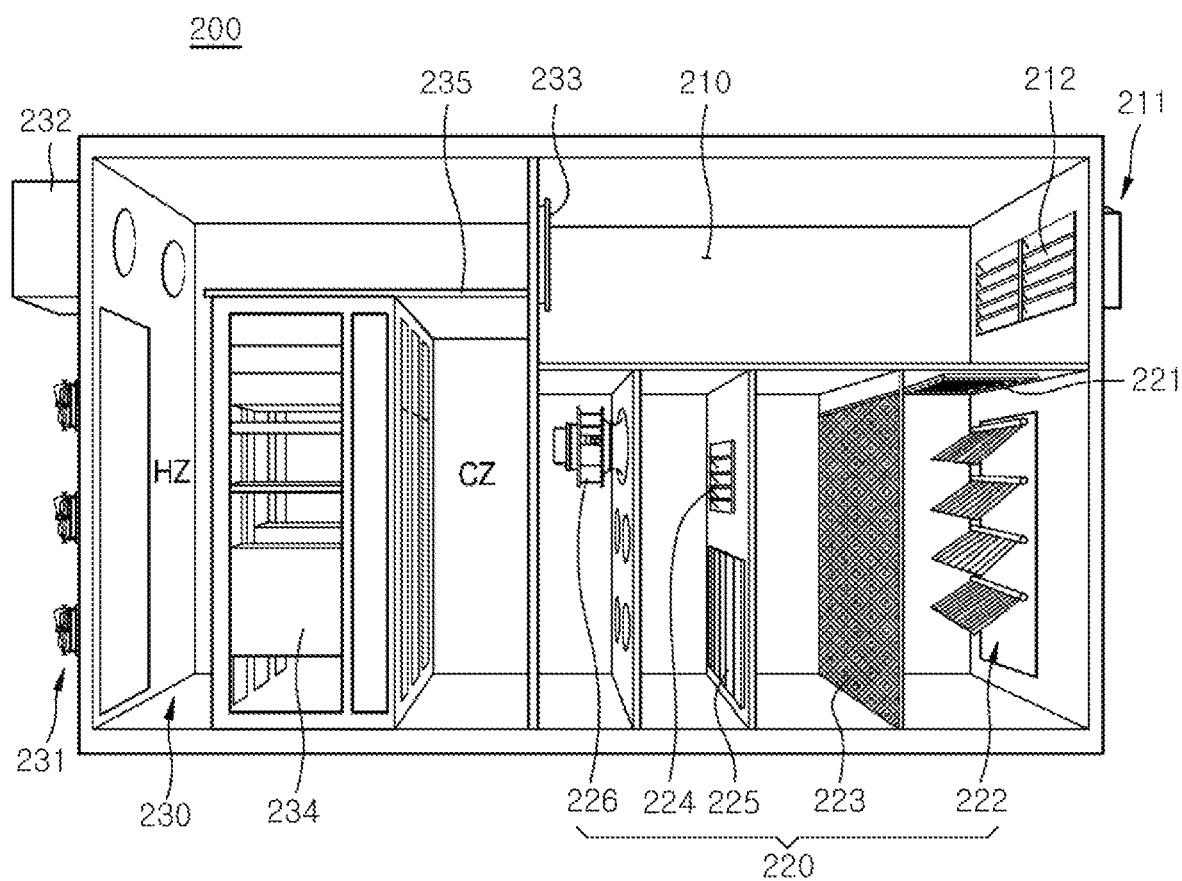
FIG. 2 illustrates an example of a server room cooling device according to an example embodiment.

FIG. 2 illustrates an example of a server room cooling device according to an example embodiment. A server room cooling device 200 according to the example embodiment is provided to describe an example of an environment in which the water cooling coil 110 of FIG. 1 is installed. Referring to FIG. 2, the server room cooling device 200 may include an outside air inlet 211, a filtering part 221, an evaporation cooler 222, a moisture eliminator 223, a bypass damper 224, a cooling member 225, a blowing part 226, a relief damper 231, an exhaust 232, and a mixing damper 233.

The server room cooling device 200 is in a structure capable of using air outside a server room 230 and may supply the cold outside air to a place, such as the data center, in which heat needs to be removed such that the area is cooled down. The server room cooling device 200 may cool an inside of the server room 230 at relatively low cost using the outside air, for example, air outside a data center building, continuously throughout the year under conditions with many changes according to a temperature/humidity state.

Also, according to the example embodiment, the server room cooling device 200 using the outside air may adjust a temperature to reach an appropriate temperature by directly taking the outside air and mixing the outside air with hot air occurring in the server room 230. Therefore, in winter season, cooling effect may be achieved without using a cooling device. Further, since the server room cooling device 200 using the outside air may be configured as a modular type, the server room cooling device 200 may be assembled, installed, and disassembled with relative ease based on necessity, and an additional cooling device may be further provided thereto.

The outside air inlet 211 may be provided on one side of a mixer 210 and may serve to allow the air outside the server room cooling device 200 to flow in the server room cooling device 200. A damper may be provided to the outside air inlet 211 and may serve to control a quantity of the outside air that flows in through the outside air inlet 211 by controlling the opening and closing of the outside air inlet 211. As an example of the damper, a motorized damper (MD) configured to automatically open and close by an electric motor or air pressure may be provided.

Also, a free filter 212 may be further provided to the outside air inlet 211. The free filter 212 may be installed in the outside air inlet 211. The free filter 212 may refer to a device that eliminates foreign substances, such as dust in the air, insects, fallen leaves, etc., and may be configured by superimposing a net with a plurality of layers or filling an object in a fibrous state. The free filter 212 may be configured to have relatively small resistance, high dust collection efficiency, and high corrosion resistance. Further, the free filter 212 may be relatively easy to clean, light in weight, and easy to handle.

The filtering part 221 may be provided between the mixer 210 and a cooler 220 and may filter the air that flows from the mixer 210 into the cooler 220. That is, the outside air that flows in through the outside air inlet 211 and the inside air that flows in through the mixing damper 233 may mix in the mixer 210 and then, may flow into the cooler 220 through the filtering part 221. The filtering part 221 may include a mesh (not shown) to eliminate a foreign substance that comes in the cooler 220. According to the example embodiment, the filtering part 221 may be provided below the outside air inlet 211 and may be provided in a direction substantially perpendicular to a direction in which the outside air flows in through the outside air inlet 211.

The evaporation cooler 222 may serve to cool the air that flows in the cooler 220. In detail, the evaporation cooler 222 may include a spray nozzle to spray water in a form of fine particles (e.g., mist) toward the outside air or the air in which the outside air and the inside air are mixed, which is inlet through the outside air inlet 211, so that a temperature and a humidity inside the cooler 220 may be maintained in an appropriate state. That is, by spraying the mist toward the outside air, the evaporation cooler 222 may increase a low humidity of the outside air and decrease a temperature of the outside air, which are characteristics of the outside air, and may enable the air suitable for an equipment operation to be supplied to an inside of the server room 230. The evaporation cooler 222 may increase the pressure of water through a pump and may directly spray the mist toward the outside air that passes through the evaporation cooler 222 through the spray nozzle. Only by directly spraying the mist toward the outside air, the evaporation cooler 222 may decrease a temperature of the outside air by about 2 to 4° C.

The moisture eliminator 223 may serve to make nonevaporable water evaporate and to prevent water particles from being scattered toward equipment ahead. To this end, the moisture eliminator 223 may be in a structure that allows the air to smoothly pass and also allows water particles to grow. For example, a three-dimensional (3D) air mat may be used.

The bypass damper 224 may refer to a damper capable of opening and closing based on necessity and may serve as a type of a resistance avoiding damper. For example, the cooling member 225 provided below the bypass damper 224 may act as resistance against the air flow during a period in which cooling is not required, for example, in winter, and may use an amount of blower power more than necessary. Accordingly, during a period in which the cooling member 225 is not in use, the bypass damper 224 may open to decrease the air resistance may decrease and reduce an amount of blower power. That is, the bypass damper 224 may be closed while cooling using the cooling member 225 and open while not cooling and may function as a resistance avoidance damper. If the bypass damper 224 is open while not cooling, the air resistance may decrease and an amount of power used to operate a blower may be saved. Accordingly, if the bypass damper 224 is open, an amount of power used to operate the blowing part 226 may decrease.

The cooling member 225 may serve to cool the outside air that passes through the moisture eliminator 223 one more time. Here, the cooling member 225 may be provided as an oval coil. For example, the cooling member 225 may be provided as a copper tube in an oval shape to minimize the air resistance and, at the same time, to enhance cooling performance at the rear of a coil. The oval coil may maintain a relatively low static pressure event at a high wind speed and may be suitable for energy saving.

The cooling member 225 may be a resistor and may be a device used when a freezer operates, such as in summer. In this case, the cooling member 225 may not be used while cooling the outside air and may be a loss element of, particularly, the blower power. Accordingly, blowing energy may be saved by opening the bypass damper 224 during a period in which the cooling member 225 is not in use.

The water cooling coil 110 of FIG. 1 may correspond to the cooling member 225. As described above, to intermittently replace the use of the freezer, supply water of a supply water tank that supplies water to a cooling tower, for example, the first cooling tower 140 and/or the second cooling tower 190, connected to the freezer may be supplied to the oval coil of the cooling member 225 and the air that flows in the cooler 220 may be cooled with hydrothermal energy contained in the supply water. In this case, an operation time of the freezer may be reduced and energy saving effect may be achieved using the hydrothermal energy of the supply water that is unused energy and also renewable energy.

The blowing part 226 may serve to supply the outside air or the air in which the outside air and the inside air are mixed, which is inlet through the outside air inlet 211 toward the server room 230. Referring to FIG. 2, since the blowing part 226 is installed in a natural flow path of the air moving along the evaporation cooler 222, the moisture eliminator 223, the bypass damper 224, and the cooling member 225 that are aligned in a straight line, the blowing part 226 may supply the outside air inlet through the outside air inlet 211 toward the server room 230. A highly efficient brushless direct current (DC) (BLDC) fan may be applied to the blowing part 226 and may save operation cost compared to a general alternating current (AC) fan.

The blowing part 226 may include a plurality of blowers. For example, a total of 9 blowers may be provided in a 3×3 structure with respect to the blowing part 226. Here, each blower may be provided at a desired location and the quantity of air may be controlled by adjusting a number of blowers to be installed or a number of blowers to operate. Here, a blower not in use may be covered with a cover to prevent the air from flowing backward.

As described above, the server room cooling device 200 may be provided as a modular type to make it possible to change an arrangement of blowers in the blowing part 226. Accordingly, since it is possible to readily change the arrangement and further install a blower based on necessity, the server room cooling device 200 may be implemented for cooling a high density server or a high exothermic server. That is, the expandability and variability of the server room cooling device 200 may be enhanced.

The relief damper 231 may serve to adjust a pressure of a hot zone HZ within the server room 230. For example, in a conventional server room cooling device, if pressure is applied in a hot zone, cooling effect of a server may decrease due to a mismatch between a displacement amount of the hot zone and an air supply amount of a cool zone. The server room cooling device 200 according to the example embodiment may further include the relief damper 231 to relieve the pressure of the hot zone HZ, and may open the relief damper 231 to decrease the pressure in the hot zone HZ if the pressure increase in the hot zone HZ.

The exhaust 232 may serve to discharge a portion of the air from an inside of the server room 230 to an outside thereof. For example, a high efficient BLDC fan may be applied to the exhaust 232 and may save operation cost compared to a general AC fan.

The mixing damper 233 may absorb the heat generated in the server room 230 and may mix the heat of the server room 230 with the cold outside air that flows in, that is, is inlet through the outside air inlet 211. Since the outside air is used, a temperature of air for cooling may be appropriately adjusted without using the freezer under some conditions, for example, if the outside air has a desired temperature or less.

The server room 230 may be provided on one side of the mixer 210 and the cooler 220, and a plurality of server racks 234 may be arranged along a first direction in the server room 230. Here, each of the plurality of server racks 234 may include a plurality of servers.

Within the server room 230, an area that connects to the cooler 220 to be supplied with the cold air from the cooler 220 may be a cool zone CZ and an area from which hot air that passes through the server rack 234 is discharged may be the hot zone HZ. The cold air supplied to the cool zone CZ may flow into the server rack 234, may be heated while passing through the plurality of servers provided to the server rack 234, and may be discharged to the outside through the hot zone HZ and the exhaust 232 connected thereto, or may be supplied again to the mixer 210 through the mixing damper 233. Accordingly, the cool zone CZ may be open through connection to the cooler 220 and the hot zone HZ may be blocked from the cooler 220. For example, the hot zone HZ and the cool zone CZ may be blocked from each other by way of a shielding member 235 to achieve efficient server cooling effect. Here, the cool zone CZ may connect to the cooler 220 to be supplied with cold air, for example, supply air, and the hot zone HZ may be blocked from the cooler 220 to discharge hot air, for example, return air, to the exhaust 232 provided in an upper portion of the server room 230.

In detail, the cold air, for example, the supply air, supplied to the cool zone CA of the server room 230 may be supplied to each server rack 234, and the hot air, for example, the return air, discharged from the server rack 234 may flow in the hot zone HZ. The air that flows in the hot zone HZ may be discharged to the outside through the exhaust 232 or may flow again into the mixer 210 if necessary.

The aforementioned server room cooling device 200 is provided as only an example of an environment in which a cooling coil according to example embodiments may be provided. Therefore, it will be apparent to one of ordinary skill in the art that a component, an installation location, or an installation order thereof may be variously modified.

Figure 3:
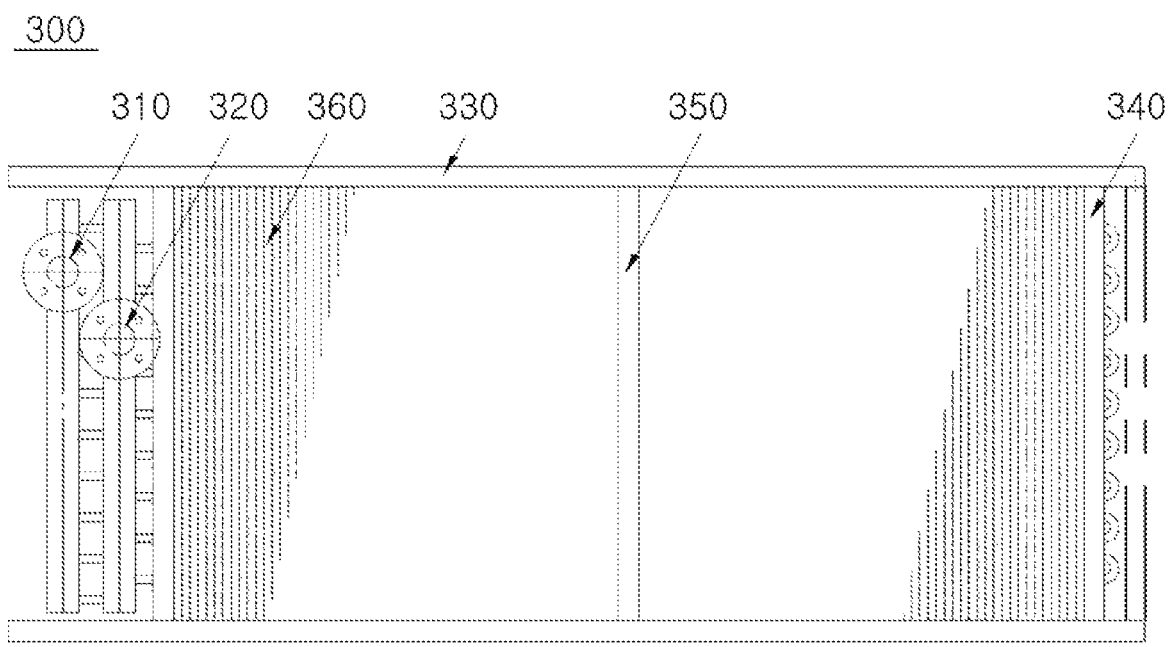
FIG. 3 illustrates an example of a configuration of a water cooling coil according to an example embodiment.

FIG. 3 illustrates an example of a configuration of a water cooling coil according to an example embodiment. FIG. 3 illustrates an example of a water cooling coil 300 configured to cool air supplied to a server room, for example, the server room 230 of FIG. 2, using water cooled through a freezer, for example, the first freezer 120 and/or the second freezer 170 of FIG. 1, or supply water to be complementarily supplied to a cooling tower, for example, the first cooling tower 140 and/or the second cooling tower 190, of the freezer. The water cooling coil 300 may correspond to the water cooling coil 110 of FIG. 1 and/or the cooling member 225 of FIG. 2.

The water cooling coil 300 may include an inlet pipe 310 configured to supply with the water cooled through the freezer or the supply water to an inside of the water cooling coil 300 and an outlet pipe 320 configured to discharge water that passes through the water cooling coil 300 to an outside thereof. The inlet pipe 310 and the outlet pipe 320 may be provided on the side of the water cooling coil 300 not to interfere with the air that passes through the water cooling coil 300. To selectively supply with the cold water cooled through the freezer or the supply water, the inlet pipe 310 may include a device configured to selectively connect to one of a first pipe through which the cold water is supplied and a second pipe through which the supply water is supplied. Also, the outlet pipe 320 may include a device configured to selectively connect to a third pipe through which the discharged water is transferred to the freezer and a fourth pipe through which the discharged water is transferred to a supply water tank storing the supply water. Depending on example embodiments, a first inlet pipe and a first outlet pipe configured to supply and return the cold water may be separately provided, a second inlet pipe and a second outlet pipe configured to supply and return the supply water may be separately provided, or a water cooling coil using the cold water and a water cooling coil using the supply water may be separately configured.

Also, according to the example embodiment, the water cooling coil 300 may include a frame including a horizontal plate 330, a vertical plate 340, and a middle plate 350. Constituent elements 360 for a cooling function using a refrigerant, such as a copper straight pipe and an aluminum pin, may be provided between such frames. This structure is provided as an example only of the water cooling coil 300. Any type of structures that allow the cold water and/or the supply water to be supplied and cool the air may be applied.

Figure 4:
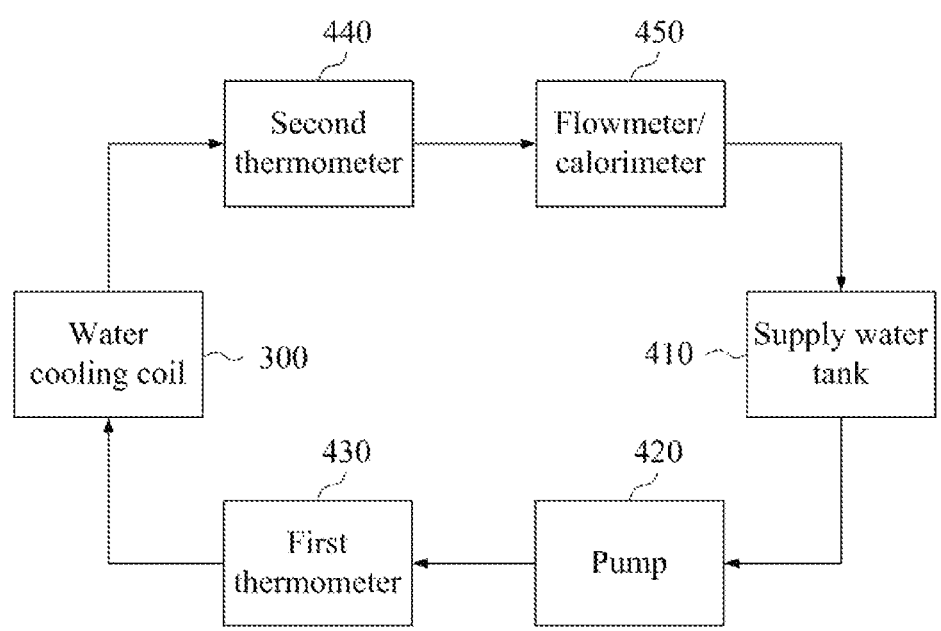
FIG. 4 illustrates an example of a process of supplying and returning supply water to and from a water cooling coil according to an example embodiment.

FIG. 4 illustrates an example of a process of supplying and returning supply water to and from a water cooling coil according to an example embodiment. Referring to FIG. 4, the water cooling coil 300 may be supplied from a supply water tank 410 with supply water that is stored in the supply water tank 410. The supply water tank 410 may correspond to the water tank 150 of FIG. 1.

A pump 420 may supply power for transferring the supply water of the supply water tank 410 to the water cooling coil 300 and may be configured as, for example, an inverter pump configured to adjust quantity of the supply water. For example, the server room cooling device 200 may include a control device (not shown) configured to control at least a portion of the aforementioned various components, for example, the first freezer 120, the second freezer 170, the outside air inlet 211, the evaporation cooler 222, the bypass damper 224, the cooling member 225, the blowing part 226, the relief damper 231, the exhaust 232 and/or the mixing damper 233, described with FIGS. 1 and 2. The pump 420 may operate under control of the control device to transfer the supply water to the water cooling coil 300.

A first thermometer 430 may be used to measure a temperature of the supply water being supplied. As described above, a temperature of the supply water stored in the supply water tank 410 may be maintained to be within a desired range by underground cooling. If supplying and returning the supply water to and from the water cooling coil 300 repeats, the temperature of the supply water stored in the supply water tank 410 may increase and the temperature of the supply water using the underground cooling may not be immediately recovered. Accordingly, a temperature at which the supply water may be supplied may be preset. If a temperature of the supply water being supplied is beyond the preset temperature, cooling using the supply water may need to be stopped. The first thermometer 430 may be used to measure such a supply temperature of the supply water.

The supply water being supplied may move along an inner coil included in the water cooling coil 300 through the inlet pipe 310 of the water cooling coil 300. Hydrothermal energy of the supply water that flows in the water cooling coil 300 may be used to cool the air that passes through the water cooling coil 300. The supply water that absorbs heat in the air may be transferred again to the supply water tank 410 through the outlet pipe 320 of the water cooling coil 300.

A second thermometer 440 may be used to measure a temperature of the supply water being returned. Here, a difference between the temperature of supply water measured at the second thermometer 440 and the temperature of supply water measured at the first thermometer 430 may be used to measure the air cooling effect using the supply water.

A flowmeter/calorimeter 450 may include an ultrasonic flowmeter or calorimeter and may be used to measure the flow and/or calories of supply water used for cooling.

Output values of the first thermometer 430, the second thermometer 440, and the flowmeter/calorimeter 450 may be transferred to the aforementioned control device, and may be used for the control device to control at least a portion of the various constituent elements for cooling.

As described above, the server room cooling device 200 may use various types of cooling schemes, for example, a cooling scheme using a freezer, a cooling scheme using ice storage heat or water storage heat, and a cooling scheme using hydrothermal energy of supply water. Here, the control device included in the server room cooling device 200 may receive output values from various sensors and may analyze a cooling environment based on the output values. Here, the control device may select, from among the various cooling schemes, a cooling scheme appropriate for the analyzed cooling environment. For example, server equipment that requires a temperature of 27° C. or less and network equipment that requires a temperature of 25° C. or less may be present in the data center. Here, if a temperature of outside air, for example, a temperature of air outside the data center is less than 25° C., the control device may cool the server room 230 using the outside air, which is described above with reference to FIG. 2. On the contrary, if the temperature of outside air is greater than 27° C., the control device may operate the freezer to cool the server room 230. If the temperature of outside air is between 25° C. and 27° C., the control device may operate the pump 420 to supply the supply water of the supply water tank 410 to the water cooling coil 300 and to cool the server room 230 using the hydrothermal energy of the supplied supply water. Also, the control device may cool the server room 230 through cooling using the ice storage heat or the water storage heat during a preset time zone of daytime. Also, the control device may select a cooling scheme based on a temperature of the hot zone HZ or the cool zone CZ of the server room 230 regardless of the outside air.

Although the example embodiments are described that cooling using a freezer and cooling using the hydrothermal energy of supply water may be all performed through a single water cooling coil, a cooling coil for cooling using the freezer and a water cooling coil for cooling using the hydrothermal energy of the supply water may be separately configured.

Figure 5:
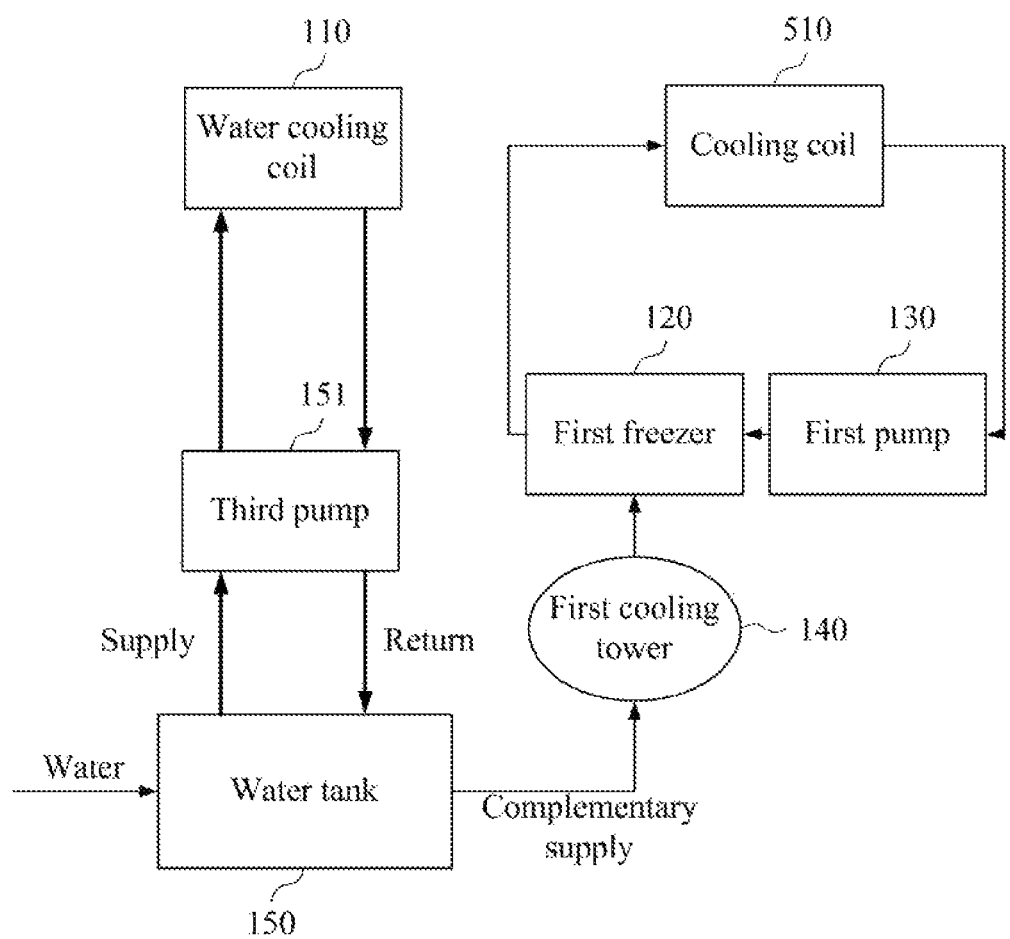
FIG. 5 illustrates another example of a cooling environment of a data center according to an example embodiment.

FIG. 5 illustrates another example of a cooling environment of a data center according to an example embodiment. FIG. 5 illustrates an example in which a cooling coil 510 (e.g., second cooling coil) for a cooling scheme using a freezer is present separate from the aforementioned water cooling coil 110 (e.g., first cooling coil). Various cooling schemes, such as a water cooling scheme, an air cooling scheme/refrigerant scheme, and the like. Here, the first freezer 120 may use other schemes such as the air cooling scheme in addition to the water cooling scheme. For example, if the first freezer 120 uses the air cooling scheme, the cooling coil 510 using the cold air may be present separate from the water cooling coil 110. Even in this case, the water cooling coil 110 may be supplied with the supply water from the water tank 150 that stores the supply water to complementarily supply water to the first cooling tower 140 of the first freezer 120 and may provide a cooling function using hydrothermal energy of the supply water. Here, the third pump 151 may be a hydrothermal cooling circulation pump.

In the meantime, the first freezer 120 may provide a cooling function using a variety of refrigerants, such as water, air, and the like. Here, the first pump 130 may be a refrigerant cooling circulation pump that supplies power for circulating a refrigerant between the first freezer 120 and the cooling coil 510.

Figure 6:
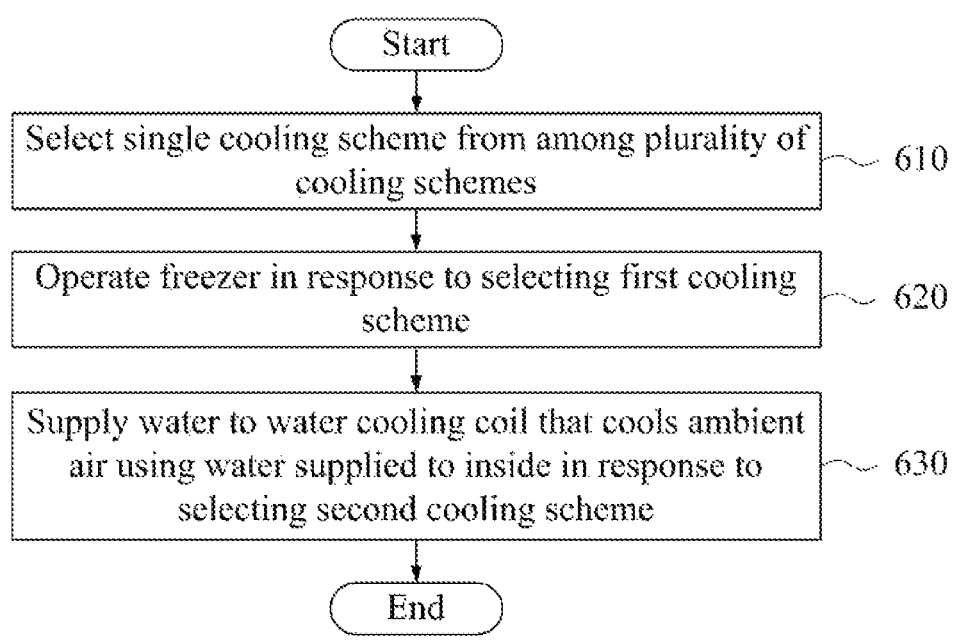
FIG. 6 is a flowchart illustrating an example of a cooling method using hydrothermal energy according to an example embodiment.

FIG. 6 is a flowchart illustrating an example of a cooling method using hydrothermal energy according to an example embodiment. The cooling method of FIG. 6 may be performed by the aforementioned control device.

Referring to FIG. 6, in operation 610, the control device may select a single cooling scheme from among a plurality of cooling schemes. Here, the plurality of cooling schemes may include a first cooling scheme using a freezer and a second cooling scheme using hydrothermal energy of supply water, and may further include a cooling scheme using outside air and a cooling scheme using ice storage heat and/or water storage heat depending on example embodiments. The cooling schemes are described above.

In operation 620, the control device may operate the freezer in response to selecting the first cooling scheme. For example, the freezer may be a device that cools water and supplies the cooled water to a water cooling coil, as described with the first freezer 120 of FIG. 1. In this case, the control device may supply the water cooling coil with the water that is cooled through the freezer operating through a cold water cooling circulation pump that supplies power for circulating the water between the water cooling coil and the freezer. In this case, the water cooling coil may include an inlet pipe configured to selectively supply with the water through one of a first path through which the water supplied through the freezer is supplied and a second path through which the supply water of the supply water tank is supplied and an outlet pipe configured to selectively discharge the water through one of a third path through which the water discharged through the water cooling coil returns to the freezer and a fourth path through which the discharged water returns to the supply water tank.

As another example, the freezer may be a device that cools a refrigerant and supplies the refrigerant to a cooling coil separate from the water cooling coil, as described above with the first freezer 120 of FIG. 5. In this case, the control device may supply the refrigerant cooled through the freezer to the cooling coil that cools ambient air using the refrigerant supplied to an inside through a refrigerant cooling circulation pump that supplies power for circulating the refrigerant between the cooling coil and the freezer.

In operation 630, the control device may supply the supply water to the water cooling coil that cools the ambient air using the water supplied to an inside in response to selecting the second cooling scheme. For example, the control device may operate a hydrothermal cooling circulation pump that supplies power for circulating the supply water between the water cooling coil and the supply water tank so that the supply water stored in the supply water tank may be supplied through the inlet pipe included in the water cooling coil to pass through the water cooling coil and return to the supply water tank through the outlet pipe included in the water cooling coil. Here, the supply water may include water stored in the supply water tank to be complementarily supplied to a cooling tower of the freezer and may contain unused energy or reusable energy.

In detail, in response to selecting the first cooling scheme, the control device may operate the cold water cooling circulation pump that supplies the power for circulating the water between the water cooling coil and the freezer, so that the water cooled through the freezer may be supplied through the inlet pipe included in the water cooling coil to pass through the water cooling coil and then return to the freezer through the outlet pipe included in the water cooling coil. Also, in response to selecting the second cooling scheme, the control device may operate the hydrothermal cooling circulation pump so that the supply water stored in the supply water tank may be supplied through the inlet pipe included in the water cooling coil to pass through the water cooling coil and then return to the supply water tank through the outlet pipe included in the water cooling coil.

As described above, according to the example embodiment, the control device may cool the air through the water cooling coil by supplying the water cooling coil with the supply water containing hydrothermal energy not in use based on a single cooling scheme.

The plurality of cooling schemes may further include a third cooling scheme using ice storage heat or water storage heat of ice or cold water accumulated in the accumulation tank using cold air or cold water that is supplied through an additional freezer. In this case, in response to selecting the third cooling scheme, the control device may supply the water cooled through the ice storage heat or the water storage heat to the water cooling coil. For example, a cooling system may further include an accumulation tank configured to accumulate ice or cold water for cooling using ice storage heat or water storage heat, an additional freezer configured to supply the cold air or the cold water to the accumulation tank, and an ice storage heat/water storage heat cooling circulation pump (e.g., accumulation pump) configured to supply power for circulating the air or the water between the accumulation tank and the additional freezer. Here, the accumulation tank, the additional freezer, and the ice storage heat/water storage heat cooling circulation pump may correspond to the accumulation tank 160, the second freezer 170, and the second pump 180 of FIG. 1, respectively. Here, supply water to be complementarily supplied to a cooling tower of the additional freezer may be further stored in the supply water tank that supplies the supply water to the water cooling coil.

Also, the water cooling coil may be provided to a cooler of a server room cooling device configured that allows outside air to flow in a server room and may cool the outside air to flow in the server room. In this case, the control device may select a single cooling scheme from among the plurality of cooling schemes based on a temperature of the outside air. Depending on example embodiments, two or more cooling schemes may be used together. For example, the cooling scheme using the outside air, the cooling scheme using the freezer may be used together. The cooling scheme using the outside air and the cooling scheme using the hydrothermal energy of the supply water may be used together.

Figure 7:
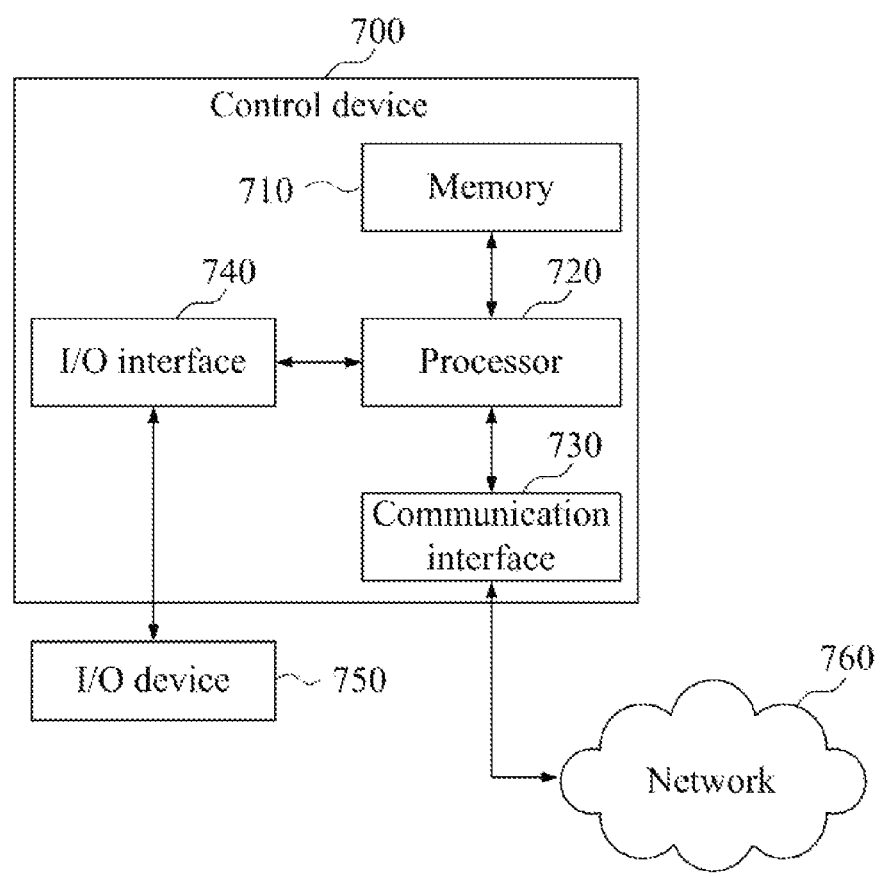
FIG. 7 is a block diagram illustrating an example of a configuration of a control device according to an example embodiment.

FIG. 7 is a block diagram illustrating an example of a configuration of a control device according to an example embodiment. A control device 700 of FIG. 7 may correspond to the control device described with FIGS. 4 through 6. Referring to FIG. 7, the control device 700 may include a memory 710, a processor 720, a communication interface 730, and an I/O interface 740. The memory 710 may include, as a non-transitory computer-readable recording medium, a permanent storage device, such as random access memory (RAM), read only memory (ROM), and disk drive. The permanent storage device, such as ROM and disk drive, may be included in the control device 700 as a separate permanent storage device distinguished from the memory 710. An operating system (OS) and at least one program code may be stored in the memory 710. Such software components may be loaded from another non-transitory computer-readable recording medium separate from the memory 710. The other non-transitory computer-readable recording medium may include, for example, a floppy drive, a disk, a tape, a DVD/CD-ROM drive, a memory card, and the like. According to other example embodiments, software components may be loaded to the memory 710 through the communication interface 730 instead of the non-transitory computer-readable recording medium. For example, at least one program may be loaded to the memory 710 of the control device 700 based on a computer program, for example, the aforementioned application, installed by developers or files provided from a file distribution system that distributes an installation file of an application through a network 760.

The processor 720 may process instructions of the computer program by performing basic arithmetic operations, logic operations, and I/O operations. The instructions may be provided to the processor 720 by the memory 710 or the communication interface 730. For example, the processor 720 may be configured to execute an instruction that is received according to a program code stored in a storage device, such as the memory 710.

The communication interface 730 may provide a function that enables the control device 700 to communicate with the aforementioned various components for cooling over the network 760. For example, the control device 700 may generate a control signal for controlling the pump 420 of FIG. 4 that supplies power for supplying and returning the supply water of the supply water tank 410 to and from the water cooling coil 300 and may transmit the control signal to the pump 420 through the communication interface 730 and the network 760.

The I/O interface 740 may be a device for interface with an I/O device 750. For example, an input device may include a device, such as a microphone, a keyboard, and a mouse, and an output device may include a device, such as a display and a speaker. As another example, the I/O interface 740 may be a device for interface with a device in which an input function and an output function are integrated into a single function, such as a touchscreen. The I/O device 750 may be configured into a single device with the control device 700. The I/O device 750 may include devices configured to receive a control input associated with various components for cooling from an administrator and to provide information associated with the components to the administrator.

According to example embodiments, it is possible to use, for cooling a data center, hydrothermal energy of supply water that is stored and maintained in a water tank at all times to be complementarily supplied to a cooling tower for operating a freezer of the data center.

The systems or apparatuses described herein may be implemented using hardware components, software components, and/or a combination thereof. For example, the apparatuses and the components described herein may be implemented using one or more general-purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable storage mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tapes; optical media such as CD-ROM discs, and DVDs; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or complementarily supplied by other components or their equivalents. Accordingly, other implementations are within the scope of the following claims.

What is claimed is:

1. A cooling system comprising:
a supply tank configured to store water, the supply tank in fluidic communication with a first cooling tower of a first freezer;
a first cooling coil in fluidic communication with the supply tank, the first cooling coil configured to cool ambient air using a hydrothermal energy of the water from the supply tank; and
a hydrothermal pump configured to circulate the water between the supply tank and the first cooling coil.

2. The cooling system of claim 1, further comprising:
a second cooling coil configured to cool the ambient air using a refrigerant; and
a refrigerant pump configured to circulate the refrigerant between the second cooling coil and the first freezer, the first freezer configured to cool the refrigerant.

3. The cooling system of claim 1, further comprising:
a cooling water pump configured to circulate the water between the first cooling coil and the first freezer, the first freezer configured to cool the water.

4. The cooling system of claim 1, further comprising:
a control device configured to select one of a first cooling scheme and a second cooling scheme, the first cooling scheme using the first freezer, and the second cooling scheme using the hydrothermal energy of the water.

5. The cooling system of claim 4, wherein the control device is configured to operate a cooling water pump to circulate the water between the first cooling coil and the first freezer in the first cooling scheme and configured to operate the hydrothermal pump to circulate the water between the first cooling coil and the supply tank in the second cooling scheme.

6. The cooling system of claim 1, wherein the first cooling coil includes an inlet pipe and an outlet pipe, the inlet pipe configured to selectively supply the water through one of a first path and a second path, the first path configured to direct the water from the first freezer to the first cooling coil, the second path configured to direct the water from the supply tank to the first cooling coil, the outlet pipe configured to selectively discharge the water through one of a third path and a fourth path, the third path configured to direct the water from the first cooling coil to the first freezer, the fourth path configured to direct the water from the first cooling coil to the supply tank.

7. The cooling system of claim 1, further comprising:
an accumulation tank configured to accumulate ice or cold water;
a second freezer configured to supply cold air or the cold water to the accumulation tank; and
an accumulation pump configured to circulate the cold air or the cold water between the accumulation tank and the second freezer,
wherein the supply tank is in fluidic communication with a second cooling tower of the second freezer.

8. The cooling system of claim 1, further comprising:
a control device configured to select one of a first cooling scheme and a second cooling scheme,
wherein the first cooling coil is part of a cooler of a server room cooling device that allows outside air to flow into a server room and is configured to cool the outside air, the first cooling scheme using the first freezer, the second cooling scheme using the hydrothermal energy of the water based on a temperature of the outside air.

9. The cooling system of claim 1, wherein the hydrothermal pump includes an inverter pump configured to adjust a quantity of the water that is supplied to the first cooling coil.

10. A cooling method using hydrothermal energy, the method comprising:
selecting a single cooling scheme from among a plurality of cooling schemes, the plurality of cooling schemes including a first cooling scheme and a second cooling scheme, the first cooling scheme using a first freezer, the second cooling scheme using a hydrothermal energy of water;
operating the first freezer in conjunction with a first cooling coil to cool ambient air in response to selecting the first cooling scheme; and
supplying the water to the first cooling coil to cool the ambient air in response to selecting the second cooling scheme, the water being from a supply tank that is in fluidic communication with a first cooling tower of the first freezer.

11. The method of claim 10, wherein the operating of the first freezer includes supplying a refrigerant to a second cooling coil to cool the ambient air with a refrigerant pump configured to circulate the refrigerant between the second cooling coil and the first freezer.

12. The method of claim 10, wherein the operating of the first freezer includes supplying the water to the first cooling coil with a cooling water pump configured to circulate the water between the first cooling coil and the first freezer.

13. The method of claim 10, wherein the supplying of the water includes operating a hydrothermal pump configured to circulate the water between the first cooling coil and the supply tank.

14. The method of claim 13, wherein the first cooling coil includes an inlet pipe and an outlet pipe, the inlet pipe configured to receive the water from the supply tank, the outlet pipe configured to return the water to the supply tank.

15. The method of claim 10, further comprising:
operating a second freezer in conjunction with the first cooling coil to cool the ambient air in response to selecting a third cooling scheme,
wherein the plurality of cooling schemes further includes the third cooling scheme, the third cooling scheme using ice or cold water accumulated in an accumulation tank which receives cold air or the cold water from the second freezer.

16. The method of claim 15, wherein the supply tank is in fluidic communication with a second cooling tower of the second freezer.

17. The method of claim 10, further comprising:
cooling outside air using the first cooling coil, the first cooling coil being part of a cooler of a server room cooling device that allows the outside air to flow into a server room,
wherein the selecting of the single cooling scheme is based on a temperature of the outside air.

* * * * *